United States Patent
Fannes et al.

(10) Patent No.: US 10,530,388 B2
(45) Date of Patent: Jan. 7, 2020

(54) SIGNAL ENCODER, DECODER AND METHODS USING PREDICTOR MODELS

(71) Applicant: AURO TECHNOLOGIES NV, Mol (BE)

(72) Inventors: Geert Fannes, Mol (BE); Bert Van Daele, Mol (BE)

(73) Assignee: AURO TECHNOLOGIES NV, Mol (BE)

(*) Notice: Subject to any disclaimer, the term of this patent is extended or adjusted under 35 U.S.C. 154(b) by 0 days.

(21) Appl. No.: 16/068,016

(22) PCT Filed: Jul. 15, 2016

(86) PCT No.: PCT/EP2016/066981
§ 371 (c)(1),
(2) Date: Jul. 3, 2018

(87) PCT Pub. No.: WO2017/118495
PCT Pub. Date: Jul. 13, 2017

(65) Prior Publication Data
US 2019/0028114 A1    Jan. 24, 2019

(30) Foreign Application Priority Data
Jan. 3, 2016  (EP) .................................. 15003698

(51) Int. Cl.
*H03M 7/34* (2006.01)
*H03M 7/30* (2006.01)
*G10L 19/00* (2013.01)
*G10L 19/04* (2013.01)
*G10L 19/005* (2013.01)

(52) U.S. Cl.
CPC ......... *H03M 7/3064* (2013.01); *G10L 19/005* (2013.01); *G10L 19/0017* (2013.01); *G10L 19/04* (2013.01); *H03M 7/30* (2013.01)

(58) Field of Classification Search
CPC ............................. H03M 7/3064; H03M 7/30
USPC ...................................................... 341/50, 51
See application file for complete search history.

(56) References Cited

U.S. PATENT DOCUMENTS

| | | | |
|---|---|---|---|
| 7,095,344 B2* | 8/2006 | Sekiguchi | H03M 7/40 341/106 |
| 8,605,588 B2* | 12/2013 | Sankaran | H04L 43/0829 370/235 |
| 2003/0151529 A1* | 8/2003 | Karczewicz | H03M 7/42 341/51 |

* cited by examiner

Primary Examiner — Peguy Jean Pierre
(74) Attorney, Agent, or Firm — Sughrue Mion, PLLC

(57) ABSTRACT

A signal encoder divides the signal into segments and uses prediction models to approximate the samples of each segment Each local prediction model, each applicable to one segment, is applied in its own translated axis system within the segment and the offset is given by the last predicted value for the previous segment. When the signal is reasonably continuous, it alleviates the need to parameterize the offset for each local predictor model as each local predictor model can build on this last predicted sample value of the previous segment.

Figure 1:
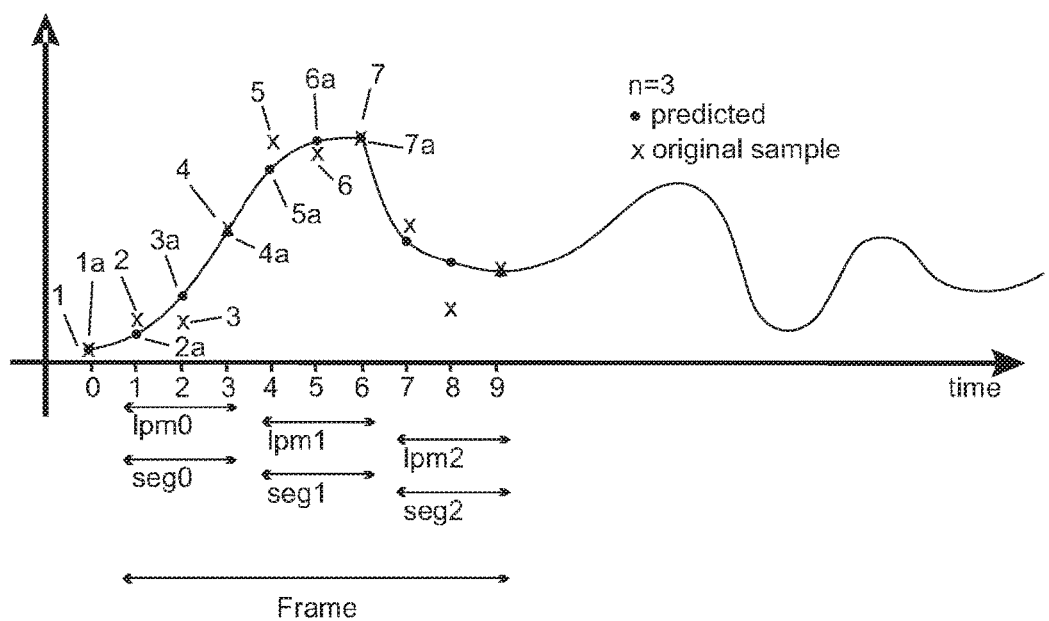

The encoder as a consequence doesn't suffer from a build up of error even though the offset is not transmitted but instead the last predicted value of the last sample of the previous segment is used. Prediction errors are obtained for the approximated samples and transmitted to the decoder, together with the predictor model parameters and seed value to allow accurate reconstruction of the signal by the decoder.

20 Claims, 5 Drawing Sheets

SIGNAL ENCODER, DECODER AND
METHODS USING PREDICTOR MODELS

BACKGROUND

Field

This invention relates to a signal encoder comprising an input for receiving a signal comprising frames, each frame comprising sequential samples, and an output for providing a encoded signal, the signal encoder further comprising a segmenter comprising an input for receiving the signal and being arranged for segmenting the sequential samples of a frame into segments comprising n sequential samples, an approximator comprising an input for receiving segments from the segmenter and seed values and an output for providing an encoded signal comprising for each segment a set of predictor model parameters to the output of the encoder, the approximator being arranged to approximate a first segment starting from a first seed sample having a first seed value and determine a first set of predictor model parameters by approximating the n sequential samples of the first segment using a first predictor model and subsequently to approximate a second segment, subsequent to the first segment, starting from a second seed sample having a second seed value and determine a second set of predictor model parameters by approximating the n sequential samples of the second segment using a second predictor model.

Description of the Related Art

Such signal encoder are known from "An application of the piecewise autoregressive model in lossless audio coding" by Yinghua Yang et al, Norsig 2006, http://citeseerx.ist.psu.edu/viewdoc/download?doi=10.1.1.330.2413&rep=rep1&type=pdf.

A disadvantage of such an encoder is that for each segment a seed value has to obtained, and this achieved by predicting the very first samples of the current frame using samples from the previous frame. This however leads to a build up of the prediction error.

SUMMARY

To overcome this disadvantage the encoder is characterized in that the second seed value equals an approximated value of a last sample n of the first segment. Each linear prediction model is applied in its own translated axis system and the offset is given by the last predicted value of the last sample of the previous segment. If, as commonly done, the value of the last sample of the previous segment is used a discontinuity is introduced as the last predicted value of the last sample of the previous segment is slightly different from value of the last sample of the previous segment, i.e. at every start of a segment an error is introduced in the form of a discontinuity leading to an undesirable offset that can build up in the course of encoding. Using the last predicted value of the last sample of the previous segment instead of the value of the last sample of the previous segment keeps this prediction error build-up under control.

In an embodiment the signal encoder further comprises a predictor model parameter clusterer arranged to cluster predictor model parameters into clusters of predictor model parameters around prediction model parameter cluster centers and where the prediction model parameters to be provided to the output of the signal encoder for each segment are prediction model parameters cluster centers to which the prediction model parameter was clustered corresponding to that segment.

The clustering of the prediction model parameters effectively quantizes the predictor model parameters within a limited set of predictor model parameters and thus reduces the data as the predictor model parameters' compressibility is greatly enhanced. For instance instead of transmitting each predictor model parameter only an index to predictor model parameter cluster centers has to be transmitted. This results in less data transmitted, respectively stored.

An embodiment of the signal encoder comprises an error approximator arranged to determine an prediction error for each sample to be corrected, the prediction error being a difference between a sample value of a sample and an approximated sample value of said sample, and where the error approximator further comprises an output for providing the prediction error for each sample to be corrected to the output of the signal encoder.

Both the use of a predictor model and the clustering of predictor model parameters introduce errors in the approximated sample value upon reconstruction. As this prediction error is known on the encoder side as it is introduced by the encoder the prediction error can be included in the encoded signal so the decoder can correct for the prediction error when reconstructing the signal. Although it requires additional bandwidth for transmitting the prediction errors, the quality of the reconstructed signal is greatly improved. Alternatively the prediction errors can be used to allow the use of a less accurate predictor model while maintaining the quality of the reconstructed signal by correcting less accurate predictions.

In an embodiment the signal encoder comprises an error clusterer arranged to cluster the prediction errors determined by the error approximator into clusters of prediction errors around error cluster centers and where the prediction error to be provided to the output of the signal encoder for each sample to be corrected is an error cluster center corresponding to the prediction error for each sample to be corrected.

Like the predictor model parameters, the prediction errors can be compressed by clustering them into clusters of prediction errors, each cluster having a cluster center. This effectively quantizes the prediction errors with a lower resolution, reducing the bandwidth as less data needs to be transmitted.

In a further embodiment the signal encoder comprises an error clusterer arranged to cluster the prediction errors determined by the error approximator into clusters of prediction errors around error cluster centers and where the prediction error to be provided to the output of the signal encoder for each sample to be corrected is an index to an error cluster center corresponding to the prediction error for each sample to be corrected.

Using an index allows a further reduction of the data rate and thus of the required bandwidth. The set of cluster centers only need to be transmitted once after which an index to the centers in the set of cluster centers is sufficient for the decoder to select the appropriate prediction error.

In a further embodiment the signal encoder is a multi-channel signal encoder and where the error clusterer is arranged to cluster the prediction errors from multiple channels into a single set of error cluster centers.

This allows the use of a common set of prediction error cluster centers for all channels, thus increasing efficiency. It has surprisingly been found that using a common set of prediction error cluster centers does not introduce significant larger errors, thus still allowing the reconstruction of the signal with sufficient quality.

A signal decoder according to the invention comprises an input for receiving an encoded signal comprising seed values and sets of predictor model parameters representing segments of the signal, an output for providing a decoded signal, the signal decoder further comprising a reconstructor comprising an input for receiving seed values and predictor model parameters from the decoder input and a reconstructor output for providing reconstructed segments comprising reconstructed samples, each reconstructed sample having a reconstructed sample value, the reconstructor being arranged to reconstruct a first segment by calculating the reconstructed sample value (recon(1) . . . recon(n)) of each reconstructed sample of the first segment using a first seed value and a first set of predictor model parameters and to reconstruct a second segment, subsequent to the first segment, by calculating the reconstructed sample value (recon (n+1) . . . recon(n+n)) of each reconstructed sample of the second segment using a second seed value and a second set of predictor model parameters, a sequencer having a sequencer input for receiving the first segment and the second segment from the reconstructor, the sequencer being arranged for constructing the decoded signal by appending the reconstructed samples of the second reconstructed segment to the reconstructed samples of the first reconstructed segment and providing the resulting decoded signal to the output of the signal decoder where the second seed value equals a last reconstructed sample value of the first segment.

This signal decoder uses the last reconstructed sample value of the previous segment to start the reconstruction using the prediction model parameters received. Each linear prediction model is applied in its own translated axis system and the offset is determined from the last reconstructed value of the last sample of the previous segment. This way the offset for each predictor model doesn't have to be received, thus saving bandwidth/storage requirements.

An embodiment of the signal decoder comprises an error compensator arranged to, for each reconstructed sample, add a corresponding prediction error to the reconstructed sample value of the reconstructed sample.

For each sample to be corrected that is to be reconstructed, a prediction error is received and added to the value of the sample as reconstructed using the prediction model determined by the received prediction model parameters. This increases the fidelity of the reconstructed signal as errors introduced by the approximation using the prediction model are reduced.

In an embodiment of the signal decoder the prediction errors to be added are error cluster centers.

The prediction errors being compressed by clustering them into clusters of prediction errors, each cluster having a cluster center on the encoder side can be used to correct the reconstructed samples. This effectively quantizes the prediction errors with a lower resolution, reducing the bandwidth as less data needs to be transmitted yet still offers a good improvement in the fidelity of the reconstructed signal, i.e. the reconstructed signal more closely matching the original signal.

In an embodiment of the signal decoder the error compensator is arranged to, for each reconstructed sample, receive a corresponding index to a set of error cluster centers from the input of the signal decoder and where the error compensator is further arranged to select an error cluster center to be added to the reconstructed sample value of the reconstructed sample from the set of error cluster centers indicated by the received corresponding index.

Using an index allows a further reduction of the data rate and thus of the required bandwidth. The set of cluster centers only need to be transmitted once after which an index to the centers in the set of cluster centers is sufficient for the decoder to select the appropriate prediction error.

In an embodiment of the signal decoder the signal decoder is a multi-channel signal decoder and the error compensator is arranged to use one set of error cluster centers for multiple channels.

Only a single set of cluster centers need to be received, thus reducing the amount of data to be transmitted, allowing the use of less bandwidth or a reduced data rate.

A recording device according to the invention has the same benefits as the encoder it comprises.

A playback device according to the invention has the same benefits as the decoder it comprises.

A computer readable storage medium according to the invention uses available storage space more efficiently as a longer duration signal can be stored, or more channels can be stored on the same storage medium. A storage medium can be optical, magnetic or solid state based.

A piecewise prediction model describes a sampled real-valued time-dependent signal of a given size (both integer or floating-point). The model can be learned efficiently from an input signal in a single pass and allows an adjustable balance between prediction error and bitrate (the number of bits needed to transmit the prediction model parameters required to describe the model), which makes it suitable for instance, for audio compression. Since the signal is divided into segments and processed segment by segment, the prediction error does not degrade over time and, depending on the choice of the local predictor model class, the prediction model parameters can be encoded efficiently with an entropy encoding method (e.g., Golomb-Rice or Huffman). The piecewise prediction model is sensitive to errors in the local predictor model parameters for each segment; these require lossless encoding.

A piecewise prediction model ppm defines a mapping between $\{t|t \in [0,N-1]\}$ and $\mathbb{Z}$ or $\mathbb{R}$ where N is the frame size, the number of sampled values, and t represents time:

$$\text{pmm}: t \to \mathbb{Z} \text{ or } \mathbb{R}, t \in [0,N-1]$$

The model subdivides this range [0,N−1] into segments of size n, starting from the second sampled value (t=1). For each segment i, the piecewise prediction model contains a local prediction model $\text{lpm}_i$ $$\text{lpm}_i : t \to \mathbb{Z} \text{ or } \mathbb{R}, t \in [1,n]$$

that is applied to generate the n samples for the corresponding segment, given the last value of the previous segment:

$$\text{ppm}(0) = \text{signal}(0)$$

$$\text{ppm}(t) = \text{ppm}(st(t)) + \text{lpm}_{st(t)/n}(t - st(t)), t > 0.$$

In this, st(t) is the seed time for t: $st(t) = \lfloor (t-1)/n \rfloor n$, t>0. E.g., for n=3, the seed time is $$st(t) = 0, t \in [1, 3], n = 3$$

$$st(t) = 3, t \in [4, 6], n = 3$$

$$st(t) = 6, t \in [7, 9], n = 3$$

...

Each local prediction model, applicable to one segment each, is applied in its own translated axis system for $t \in [1,n]$ and offset given by the last predicted value for the previous segment. Assuming that the signal is reasonably continuous, there is no need to parameterize the offset for each local predictor model as each local predictor model can build on this last predicted ppm(st(t)) of the previous segment.

A quadratic local predictor model looks like qpm(t)=at+bt$^2$, but it is preferred to parameterize it as qpm(t)=at+bt(t−1)/2. The latter has a clear filter interpretation where the next value is predicted as the previous value incremented with some delta d. Initially, this delta d is set to a, but the delta itself is adjusted with b after each prediction:

$$qpm(0) := ppm(st), d := a$$
$$qpm(1) = qpm(1-1) + d, d = d + b$$
$$qpm(2) = qpm(2-1) + d, d = d + b$$
$$\ldots$$
$$qpm(i) = qpm(i-1) + d, d = d + b$$
$$\ldots$$

This leads to $$d(t) = a + tb$$

$$qpm(t) = qpm(t-1) + d(t-1)$$
$$\ldots$$
$$= qpm(0) + \sum_{i=0}^{t-1} d(i)$$
$$= ppm(st) + \sum_{i=0}^{t-1}(a + ib)$$
$$= seed + at + b\sum_{i=0}^{t-1} i$$
$$= seed + at + bt(t-1)/2$$

which is a second order polynomial in t.

To learn the parameters of the subsequent prediction models, it is important to take the reconstruction into account. Each local predictor model is trained to approximate the mapping between local time t∈[1, n] and the translated signal samples signal(t)−ppm(st(t)). The signal is translated with ppm(st(t)), the predicted last value of the previous segment, and not with the corresponding original signal value to keep the prediction error build-up under control.

To go into more details (see figure): the first sample of a frame is called the seed, and is used to translate the next n samples (t∈[1,n]) that are used to learn the first local predictor model lpm$_0$. The second predictor model lpm$_1$ is trained on the next n samples (t∈[n+1,2n]), but this time translated with lpm$_0$(n). We continue this procedure for the subsequent predictor models and apply appropriate padding for the last model, if needed.

It is to noted that an example of a predictor model is a polynomial function and the predictor model parameters in that case are the polynomial function parameters.

Whenever this description refers to transmission of data this is to be understood to also include storage data such as predictor model parameters and seed values. Transmission and data storage equally benefit from the present invention as the amount of data to be transmitted/stored is reduced. Sometimes all samples need correction for prediction errors introduced by the approximation during the prediction process but depending on the choices made in the approximation process only some samples need correction as the model may be used in a way that for instance the last sample has a negligible prediction error. That way, no prediction error or index to an prediction error cluster center need to be provided for that last sample. The same is valid for the first sample of a segment when the model is chosen to accurately reflect the original sample. When a prediction model is used such that the first and last sample of the segment are accurately approximated without significant errors, only prediction errors for the remaining samples of the segment need to be determined and transmitted. For a segment having 4 samples a 50% reduction in prediction errors to be transmitted is achieved.

SUMMARY

Figure 2:
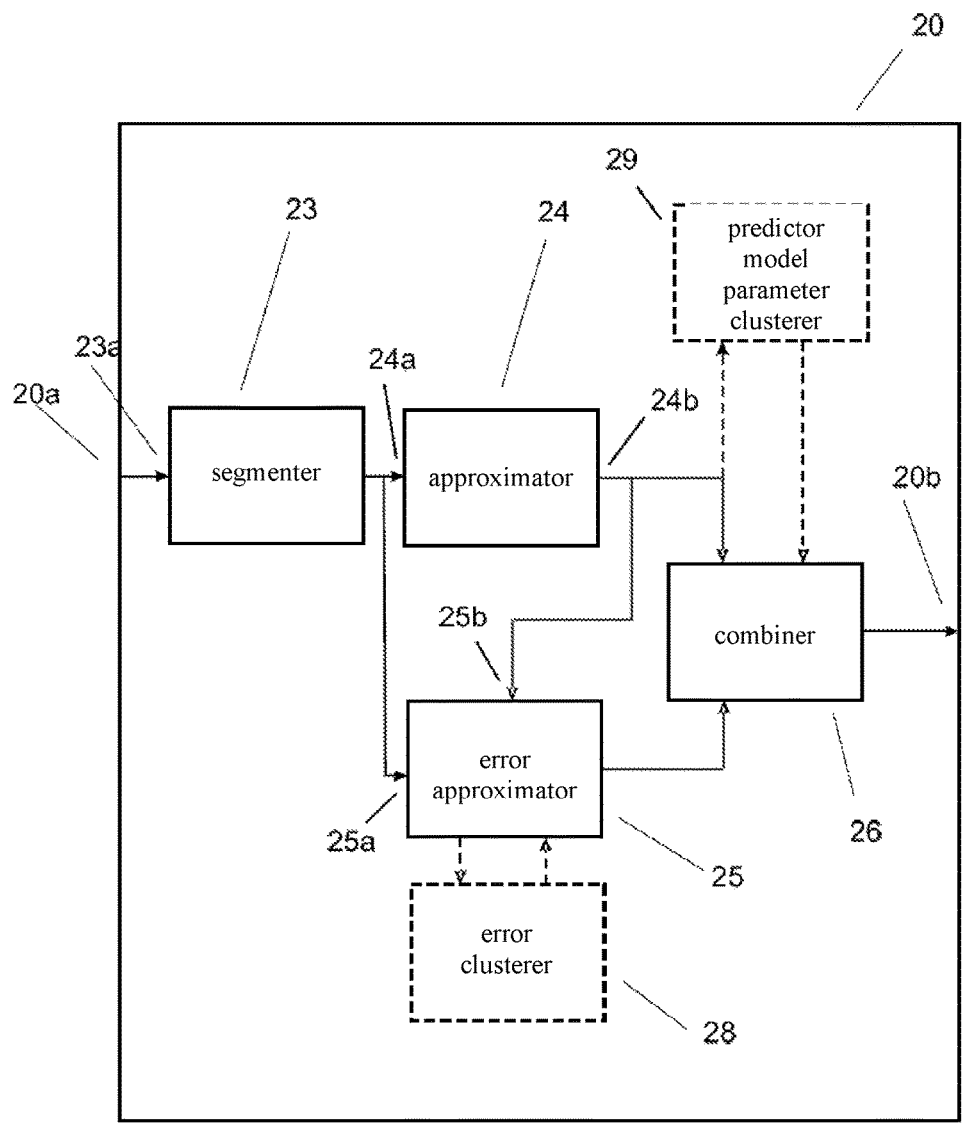
Figure 3:
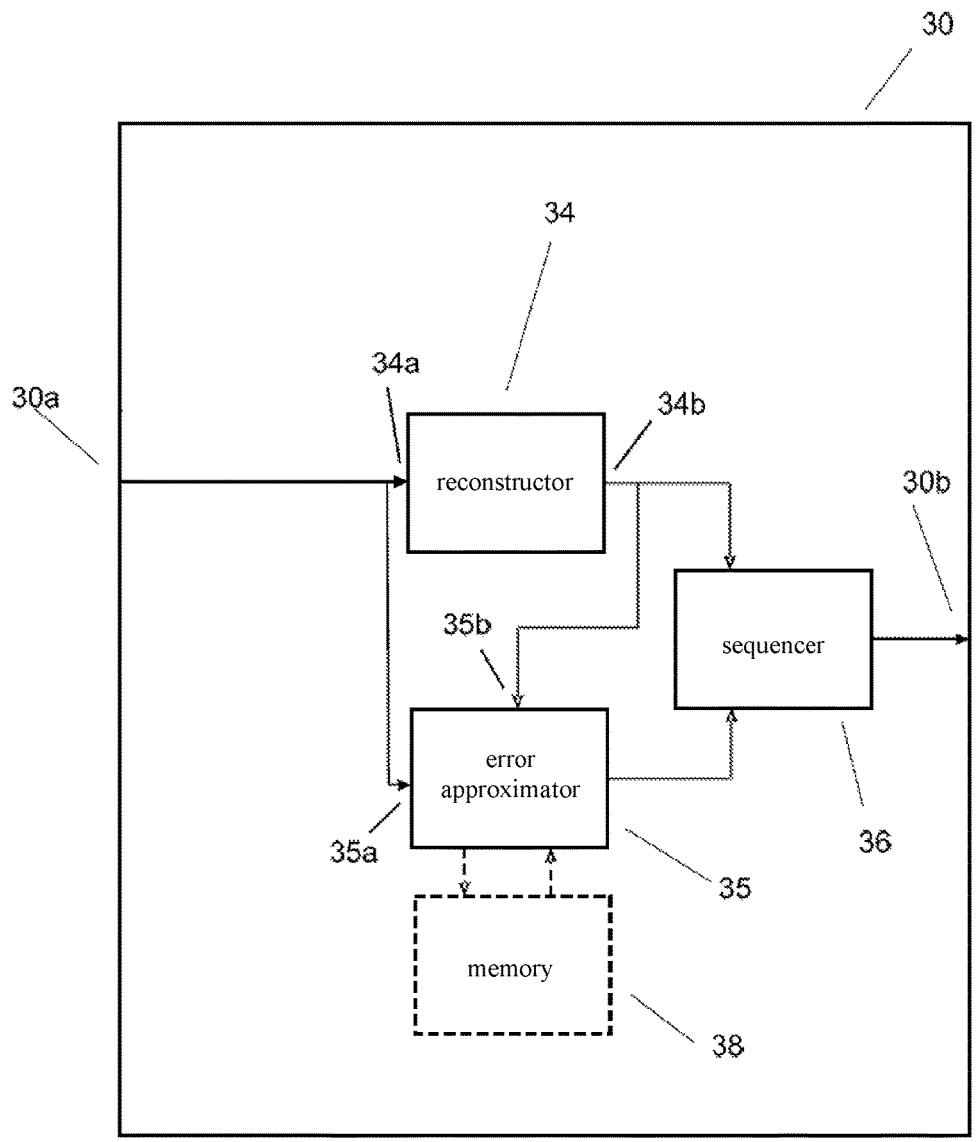
Figure 4:
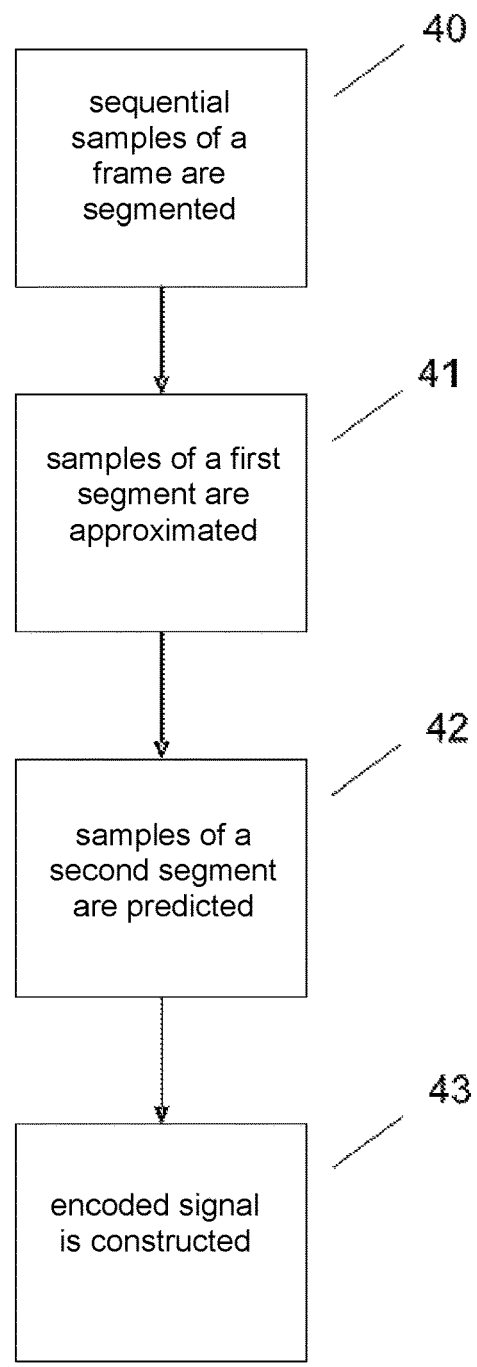
Figure 5:
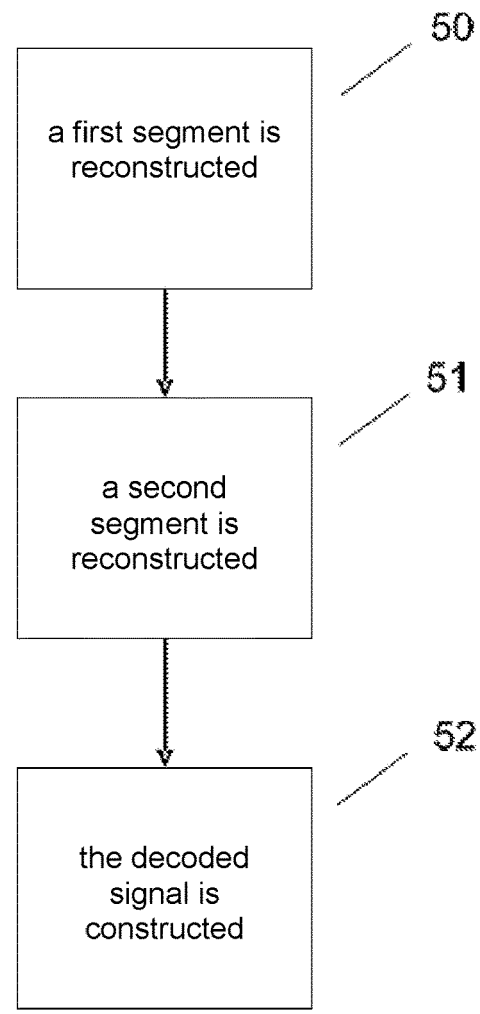

The invention will now be described based on figures.
FIG. 1 shows a piecewise prediction model being applied to a signal.
FIG. 2 shows an encoder.
FIG. 3 shows a decoder.
FIG. 4 shows an encoding method.
FIG. 5 shows a decoding method.

DETAILED DESCRIPTION OF EMBODIMENTS

FIG. 1 shows a piecewise prediction model being applied to a signal.

Although n can have any value in FIG. 1 the value n=3 is used.

The first sample 1 of a frame is called the seed, and is used to translate the next n samples (t∈[1,n]) that are used to learn the first local predictor model lpm$_0$. The second predictor model lpm$_1$ is trained on the next n samples (t∈[n+1,2n]), but this time using lpm$_0$(n) as the seed. This procedure is continued for the subsequent predictor models lpm$_2$. For the last model appropriate padding is applied if needed.

For the linear and quadratic model classes, training consists of minimizing the combined quadratic prediction error, which corresponds with fitting a regression model with quadratic cost function. The piecewise prediction model is used as a first approximation of the audio signal, and its quality can be improved later with by adding correction of the prediction error. In FIG. 2 there is no prediction error for the first sample 1 as there is no difference between the original sample 1 and the approximated sample 1*a*. For the second and third sample there is an prediction error as shown as there is a difference in value between the original sample 2,3 and the approximated samples 2*a*, 3*a*. For n=3, 3 error correction deltas per segment would be needed.

As the approximated value of the last sample of the previous segment is used as a seed for the next segment there will be no discontinuity between segments in the form of an offset. One could combat this offset by sending an offset correction for each segment but that would be undesirable as it would add to the data volume needed to be stored or transmitted.

To reduce the bitrate further, these error correction deltas are approximated using a vector quantization technique: the error correction deltas (the prediction errors) are clustered, and only the cluster centers are to be transmitted. In addition, it is possible to only send an index to a cluster center instead of the cluster center itself. Optionally only the cluster-to-be-used per segment are retained and transmitted. Clustering in 3 dimensions gives sub-optimal results audio quality-wise, which is why an extra restriction is used during the quadratic model training: the quadratic model is required to approximate the last value of the last sample of the segment exactly:

$$S_3 := \text{signal}(3) - \text{seed}$$
$$= qpm(3)$$
$$= 3a + 3b$$

which gives $$a = S_3/3 - b$$

This is shown in FIG. 1 as the last approximated sample 4a of the first segment seg0 and the last approximated sample 7a of the second segment seg1 are equal to their respectively corresponding original last samples 4, 7.

This exact approximation has the additional benefit that no prediction error needs to be transmitted for this last sample, reducing bandwidth requirements as only 2 out of three samples need prediction error transmission.

Below the seed offset will be omitted from the formulas. The quadratic error then becomes:

$$\text{error} = (qpm(1) - S_1)^2 + (qpm(2) - S_2)^2 + (qpm(3) - S_3)^2$$
$$= (a - S_1)^2 + (2a + b - S_2)^2 + (0)^2$$
$$= (S_3/3 - b - S_1)^2 + (2S_3/3 - 2b + b - S_2)^2 + (0)^2$$
$$= (b + S_1 - S_3/3)^2 + (b + S_2 - 2S_3/3)^2$$

and its minimum is found when the derivative with respect to b becomes 0:

$$0 = \frac{\partial \text{error}}{\partial b}$$
$$0 = 2(b + S_1 - S_3/3) + 2(b + S_2 - 2S_3/3)$$
$$0 = b + S_1 - S_3/3 + b + S_2 - 2S_3/3$$
$$0 = 2b + S_1 + S_2 - S_3$$

This gives $$a = S_3/3 - b$$

and $$b = (-S_1 - S_2 + S_3)/2 \text{ or}$$
$$b = \frac{\text{signal}(3) - \text{signal}(2)}{2} - \frac{\text{signal}(1) - \text{seed}}{2}$$

The last formula denotes the b coefficient as a difference of differences, which corresponds with its quadratic interpretation.

The model is fully described by the seed value and the model parameters for the predictor models. To restrict the bitrate further, the parameters of the polynomial models (also often referred to as the coefficients of the polynomial model) can be approximated with values taken from the set $\{x|x=sk, k \in \mathbb{Z}\}$ where the scalers controls the quantization precision of the approximation. As such, the scaler s needs to be described once (as it is taken to be constant over a frame) together with the different k values corresponding with the different model parameters. Note that the predicted value is to be used in combination with these approximated coefficients sk in the learning procedure above to make sure the reconstruction doesn't suffer from error build-up.

FIG. 2 Shows an Encoder

The signal encoder 20 comprises an input 20a for receiving a signal comprising frames, each frame comprising sequential samples, and an output 20b for providing a encoded signal, the signal encoder 20 further comprising a segmenter 23 comprising an input 23a for receiving the signal and being arranged for segmenting the sequential samples of a frame into segments comprising n sequential samples, and an approximator 24 comprising an input 24a for receiving segments from the segmenter 23 and seed values and a output 24b for providing an encoded signal comprising for each segment a set of predictor model parameters to the output 20b of the encoder 20, the approximator 24 being arranged to approximate a first segment starting from a first seed sample having a first seed value and determine a first set of predictor model parameters by approximating the n sequential samples of the first segment using a first predictor model and subsequently to approximate a second segment, subsequent to the first segment, starting from a second seed sample having a second seed value and determine a second set of predictor model parameters by approximating the n sequential samples of the second segment using a second predictor model, where the second seed value equals an approximated value of a last sample n of the first segment.

It should be noted that in FIG. 2 an optional combiner 26 is shown. In case no prediction errors are to be provided to the output 20b of the encoder 20 the output 24b of the approximator 24 can be directly coupled to the output 20b of the encoder 20, thus omitting the combiner 26.

If however prediction errors are to be used to enable a decoder to reduce the prediction errors during reconstruction of the signal, the encoder comprises an error approximator 25 arranged to determine an prediction error for each sample to be corrected, the prediction error being a difference between a sample value of a sample, received from the segmenter 23 via a first error approximator input 25a and an approximated sample value of said sample received from the approximator 24 via a second error approximator input 25b, and where the error approximator further comprises an output 25c for providing the prediction error for each sample to be corrected to the output of the signal encoder or to the combiner 26, which subsequently combines the prediction model parameters received from the approximate 24 with the prediction error received from the error approximator 25.

In case the signal encoder is arranged to further reduce the amount of data to be transmitted by compressing the prediction errors the signal encoder comprises an error clusterer 28 arranged to cluster the prediction errors determined by the error approximator 25 into clusters of prediction errors around error cluster centers and where the prediction error to be provided to the output 20b of the signal encoder or the combiner 26 for each sample to be corrected is an error cluster center corresponding to the prediction error for each sample to be corrected.

The error clusterer 28 can optionally be arranged to cluster the prediction errors determined by the error approximator into clusters of prediction errors around error cluster centers and provide an index to an error cluster center corresponding to the prediction error for each sample to be corrected to the output of the signal encoder for each sample to be corrected.

In case the signal encoder is a multi-channel signal encoder and the error clusterer 28 can be shared between multiple encoders (an encoder for each channel) or a single encoder can encode multiple channels in parallel. By sharing the error clusterer 28 not only just a single error clusterer is needed, but also the prediction errors from multiple channels can be clustered into a single set of error cluster centers and the indexes corresponding to the approximated samples for all channels refer to a single set of error cluster centers, thus reducing the complexity on the decoder side as well.

Alternatively or in parallel the signal encoder can comprise a predictor model parameter clusterer 29 arranged to cluster predictor model parameters received from the approximator 24 into clusters of predictor model parameters around prediction model parameter cluster centers and the prediction model parameters cluster centers to which the prediction model parameter was clustered corresponding to that segment are to be provided to the output 20b or combiner 26 of the signal encoder 20 for each segment. In that case the prediction model parameters are not provided to the output 20b or combiner 26 and only the dotted elements connect the approximator 24 to the output 20b or the combiner 26.

FIG. 3 Shows a Decoder.

The signal decoder 30 comprises an input 30a for receiving an encoded signal comprising seed values and sets of predictor model parameters representing segments of the signal, and an output 30b for providing a decoded signal. The signal decoder 30 further comprising a reconstructor 34 comprising an input 34a for receiving seed values and predictor model parameters from the decoder input 30a and a reconstructor output 34b for providing reconstructed segments comprising reconstructed samples, each reconstructed sample having a reconstructed sample value, the reconstructor being arranged to reconstruct a first segment by calculating the reconstructed sample value (recon(1) ... recon(n)) of each reconstructed sample of the first segment using a first seed value and a first set of predictor model parameters and to reconstruct a second segment, subsequent to the first segment, by calculating the reconstructed sample value (recon(n+1) ... recon(n+n)) of each reconstructed sample of the second segment using a second seed value and a second set of predictor model parameters, and a sequencer 36 having a sequencer input for receiving the first segment and the second segment from the reconstructor 34, the sequencer 36 being arranged for constructing the decoded signal by appending the reconstructed samples of the second reconstructed segment to the reconstructed samples of the first reconstructed segment and providing the resulting decoded signal to the output 30b of the signal decoder 30 where the second seed value equals a last reconstructed sample value of the first segment.

To improve signal fidelity the signal decoder can comprise an error compensator 35 arranged to, for each reconstructed sample to be corrected, add a corresponding prediction error received from the input 30a of the signal decoder 30 to the reconstructed sample value of the reconstructed sample. For that the error compensator 35 receives prediction error via a first input 35a from the input 30a of the signal decoder 30, and via a second input 35b the corresponding reconstructed samples in segments from the reconstructor 34. After summing the corresponding prediction errors to the reconstructed samples the error compensator 25 provides the error compensated samples in segments to the sequencer 36. It is to be noted that FIG. 3 shows the sequencer receiving both the reconstructed samples from the reconstructor 34 and the error compensated samples from the error compensator 35, but only one is actually provided as they are different embodiments as the error compensator is optional.

If the error compensated samples are received from the error compensator 35 there is no need for the reconstructed samples as they have a lower signal fidelity.

Optionally the prediction errors to be added are error cluster centers. For that the error compensator is coupled to a memory 38 holding error cluster centers. When the error compensator receives and index referring to an error cluster center in the memory 38 it retrieves the cluster center value corresponding to that index from the set of error cluster centers in the memory and adds it to the reconstructed sample to be corrected to which the index corresponds.

In case the signal decoder is a multi-channel signal decoder the error compensator 35 and optional memory 38 can be shared amongst multiple encoders each handling a different channel or a single decoder handles multiple channels in parallel. This reduces the need for multiple error compensators, reducing the cost and complexity of the decoder 30.

FIG. 4 Shows an Encoding Method.

The encoding method encodes a signal comprising frames, each frame comprising sequential samples into an encoded signal.

In a first step 40 the sequential samples of a frame are segmented into segments comprising n sequential samples.

Subsequently in a second step 41 the samples of a first segment, are approximated using a prediction model, starting from a first seed sample having a first seed value. The result of this approximation is a first set of predictor model parameters obtained by finding prediction model parameters that best predicting the n sequential samples of the first segment using a first predictor model.

Subsequently in the third step 42 the samples of a second segment are predicted, but in this case starting from a second seed sample having a second seed value equaling the predicted value of a last sample of the first segment obtained in the second step 41. In this way a second set of predictor model parameters is obtained by finding those predictor model parameters that lead to the best predicting of the n sequential samples of the second segment using the second predictor model.

Note that the predicted value is to be used in combination with these approximated model parameters sk in step 42 above to make sure the reconstruction doesn't suffer from error build-up.

In a fourth step 43 the encoded signal is constructed according to a predefined format comprising seed values and prediction model parameters is provided to the output of the encoder, to be transmitted or to be stored.

Between the third step 42 and the fourth step 43 an optional step can be introduced of clustering predictor model parameters into clusters of predictor model parameters around prediction model parameter cluster centers and where the prediction model parameters to be included in the encoded signal for each segment are prediction model parameters cluster centers to which the prediction model parameter was clustered corresponding to that segment. As the predictor model parameters obtained in the second step 41 and the third step 42 are available at this point they can be clustered around cluster centers and these cluster centers can be used to represent the prediction errors, allowing compression of the data amount.

Between the third step 42 and the fourth step 43 another optional step can be introduced of determining an prediction error for each sample to be corrected, the prediction error being a difference between a sample value of a sample and an predicted sample value of said sample, and providing the prediction error for each sample to be corrected for inclusion in the encoded signal.

As at this point in the process both the original samples and the predicted/approximated samples are available the difference between them, the prediction error, can be determined and provided to the fourth step 43 in which the encoded signal is constructed according to a predefined format comprising the seed values, the predictor model parameters and the prediction errors.

The additional step of determining an prediction error for each sample to be corrected can further be improved by clustering the prediction errors into clusters of prediction errors around error cluster centers and provide for each sample to be corrected a prediction error cluster center or an index to that prediction error cluster center corresponding to the prediction error for each sample to be corrected for inclusion in the encoded signal.

FIG. 5 Shows a Decoding Method.

The decoding method decodes an encoded signal comprising seed values and sets of predictor model parameters representing segments of the encoded signal.

In a first step 50 a first segment is reconstructed by calculating a reconstructed sample value (recon(1) ... recon(n)) of each reconstructed sample of that first segment using a first seed value and a first set of predictor model parameters.

In a second step 51 a second segment is reconstructed, subsequent to the first segment, by calculating a reconstructed sample value (recon(n+1) ... recon(n+n)) of each reconstructed sample of the second segment using a second seed value equals a last reconstructed sample value of the first segment obtained in first step 50 and a second set of predictor model parameters.

In a third step 52, the decoded signal is constructed by appending the reconstructed samples of the second reconstructed segment to the reconstructed samples of the first reconstructed segment, The decoding method can further be improved by appending an addition step after the third step 53 in which, for each reconstructed sample, a corresponding prediction error is added to the reconstructed sample value of the reconstructed sample. The prediction error can be a clustered prediction error, in which case only the prediction error cluster center or an index to that prediction error cluster center is needed.

In the first step 50 and second step 51 reconstructing the original signal that was used to learn the piecewise prediction model comes down to evaluating this piecewise prediction model for $t \in [0, N-1]$. The piecewise prediction model equations $$ppm(0) = signal(0)$$

$$ppm(t) = ppm(st(t)) + lpm_{st(t)/n}(t - st(t)), t > 0.$$

can be used directly to perform this reconstruction resulting in the reconstructed signal.

This shows that reconstruction starts with the seed value, and applies each local prediction model in turn to generate the next n values of the reconstruction:

$$recon(0) = seed$$

$$recon(1) = recon(0) + lpm_0(1)$$

...

$$recon(n) = recon(0) + lpm_0(n)$$

$$recon(n + 1) = recon(n) + lpm_1(1)$$

...

$$recon(n + n) = recon(n) + lmp_1(n)$$

...

Note that each local prediction model builds on the offset given by the last reconstructed sample of the previous segment: to reconstruct for $t=kn+i, k \in \mathbb{N}$, $i \in [1,n]$, recon(kn) is used as starting point and the output of the local prediction model $lpm_k(i)$ is subsequently added. Thus avoiding the build up of an error.

The invention claimed is:

1. A signal encoder comprising:
   an input for receiving a signal comprising a plurality of frames, each of the plurality of frames comprising sequential samples;
   an output for providing an encoded signal;
   a segmenter comprising an input for receiving the signal and being arranged for segmenting the sequential samples of a frame, among the plurality of frames, into a plurality of segments comprising n sequential samples,
   an approximator comprising an input for receiving the plurality of segments from the segmenter and seed values and an output for providing the encoded signal comprising for each segment, among the plurality of segments, a set of predictor model parameters to the output of the signal encoder including a first set of predictor model parameters and a second set of predictor model parameters,
   the approximator being arranged to:
   predict samples of a first segment, among the plurality of segments, starting from a first seed sample having a first seed value, among the seed values, and determine the first set of predictor model parameters by approximating the n sequential samples of the first segment using a first predictor model, and
   subsequently predict samples of a second segment, among the plurality of segments, subsequent to the first segment, starting from a second seed sample having a second seed value, among the seed values, and determine the second set of predictor model parameters by predicting the n sequential samples of the second segment using a second predictor model,
   wherein the second seed value equals a predicted value of a last sample n of the first segment.

2. The signal encoder as claimed in claim 1, further comprising:
   a predictor model parameter clusterer arranged to cluster the set of predictor model parameters into clusters of predictor model parameters around prediction model parameter cluster centers,
   wherein the predictor model parameters to be provided to the output of the signal encoder for each of the plurality of segments are predictor model parameters cluster centers to which the prediction model parameter was clustered corresponding to the respective segment.

3. The signal encoder as claimed in claim 1, further comprising
   a prediction error approximator arranged to determine a prediction error for each sample, among the sequential samples, to be corrected, the prediction error being a difference between a sample value of a sample and a predicted sample value of said sample, wherein the prediction error approximator further comprises an output for providing the prediction error for said each sample to be corrected to the output of the signal encoder.

4. The signal encoder as claimed in claim 3, further comprising:

an error clusterer arranged to cluster the prediction errors determined by the prediction error approximator into clusters of prediction errors around error cluster centers, wherein the prediction error to be provided to the output of the signal encoder for each sample to be corrected is an error cluster center corresponding to the prediction error for each sample to be corrected.

5. The signal encoder as claimed in claim 4, wherein the signal encoder is a multi-channel signal encoder, and wherein the error clusterer is arranged to cluster the prediction errors from multiple channels into a single set of error cluster centers.

6. The signal encoder as claimed in claim 3, further comprising:

an error clusterer arranged to cluster the prediction errors determined by the prediction error approximator into clusters of prediction errors around error cluster centers, and wherein the prediction error to be provided to the output of the signal encoder for each sample to be corrected is an index to a prediction error cluster center corresponding to the prediction error for each sample to be corrected.

7. A recording device comprising the signal encoder as claimed in claim 1.

8. A signal decoder comprising:

an input for receiving an encoded signal comprising seed values and sets of predictor model parameters representing a plurality of segments of the encoded signal;

an output for providing a decoded signal;

a reconstructor comprising a reconstructor input for receiving the seed values and the sets of predictor model parameters from the input of the decoder and a reconstructor output for providing reconstructed segments comprising reconstructed samples, each of the reconstructed samples having a reconstructed sample value, the reconstructor being arranged to:

reconstruct a first segment by calculating the reconstructed sample value (recon(1) . . . recon(n)) of each of the reconstructed samples of the first segment using a first seed value, among the seed values, and a first set of predictor model parameters, among the sets of predictor model parameters, and reconstruct a second segment, subsequent to the first segment, by calculating the reconstructed sample value (recon(n+1) . . . recon(n+n)) of each of the reconstructed samples of the second segment using a second seed value, among the seed values, and a second set of predictor model parameters, among the sets of predictor model parameters; and a sequencer having a sequencer input for receiving the first segment and the second segment from the reconstructor, the sequencer being arranged for constructing the decoded signal by appending the reconstructed samples of the second reconstructed segment to the reconstructed samples of the first reconstructed segment and providing the resulting decoded signal to the output of the signal decoder, wherein the second seed value equals a last reconstructed sample value of the first segment.

9. The signal decoder as claimed in claim 8, comprising a prediction error compensator arranged to, for each of the reconstructed samples to be corrected, add a corresponding prediction error to the reconstructed sample value of the respective reconstructed sample.

10. The signal decoder as claimed in claim 9, where wherein the prediction errors to be added are error cluster centers.

11. The signal decoder as claimed in claim 9, wherein the prediction error compensator is arranged to, for each of the reconstructed samples to be corrected, receive a corresponding index to a set of prediction error cluster centers from the input of the signal decoder, and wherein the prediction error compensator is further arranged to select a prediction error cluster center to be added to the reconstructed sample value of the respective reconstructed sample, among the reconstructed samples to be corrected, from the set of prediction error cluster centers indicated by the received corresponding index.

12. The signal decoder as claimed in claim 9, wherein the signal decoder is a multi-channel signal decoder, and wherein the prediction error compensator is arranged to use one set of prediction error cluster centers for multiple channels.

13. A playback device comprising a decoder as claimed in claim 8.

14. A method for encoding a signal comprising a plurality of frames into an encoded signal, each of the frames comprising sequential samples, the encoding method comprising:

segmenting the sequential samples of a frame, among the plurality of frames, into a plurality of segments comprising n sequential samples, predicting samples of a first segment, among the plurality of segments, starting from a first seed sample having a first seed value, and determining a first set of predictor model parameters by predicting the n sequential samples of the first segment using a first predictor model, and subsequently predicting samples of a second segment, among the plurality of segments, subsequent to the first segment, starting from a second seed sample having a second seed value and determining a second set of predictor model parameters by predicting the n sequential samples of the second segment using a second predictor model; and outputting the encoded signal comprising seed values and a set of predictor model parameters to the output of the encoder, the seed values including the first seed value and the second seed value, and the set of predictor model parameters including the first set of predictor model parameters the second set of predictor model parameters, wherein the second seed value equals a predicted value of a last sample of the first segment.

15. The encoding method as claimed in claim 14, further comprising:

clustering the set of predictor model parameters into clusters of predictor model parameters around prediction model parameter cluster centers, wherein the predictor model parameters to be included in the encoded signal for each segment are predictor model parameters cluster centers to which the prediction model parameter was clustered corresponding to that segment.

16. The encoding method as claimed in claim 14, further comprising:

determining a prediction error for each sample to be corrected, the prediction error being a difference between a sample value of the respective sample and a predicted sample value of said respective sample, and providing the prediction error for said each sample to be corrected for inclusion in the encoded signal.

17. The encoding method as claimed in claim 16, further comprising:

clustering the prediction errors into clusters of prediction errors around error cluster centers and provide for each sample to be corrected a prediction error cluster center corresponding to the prediction error for each sample to be corrected for inclusion in the encoded signal.

18. A computer readable storage medium comprising a signal obtained using the method of claim 14.

19. A decoding method for decoding an encoded signal comprising seed values and sets of predictor model parameters representing segments of the encoded signal, the decoding method comprising:

reconstructing a first segment by calculating a reconstructed sample value (recon(1) . . . recon(n)) of each of a plurality of reconstructed samples of a first segment using a first seed value and a first set of predictor model parameters and reconstructing a second segment, subsequent to the first segment, by calculating a reconstructed sample value (recon(n+1) . . . recon(n+n)) of each of a plurality of reconstructed samples of the second segment using a second seed value and a second set of predictor model parameters, and constructing the decoded signal by appending the plurality of reconstructed samples of the second reconstructed segment to the plurality of reconstructed samples of the first reconstructed segment, wherein the second seed value equals a last reconstructed sample value of the first segment.

20. The decoding method as claimed in claim 19, further comprising:

adding for each reconstructed sample, a corresponding prediction error to the reconstructed sample value of the reconstructed sample.

\* \* \* \* \*